United States Patent
Lim et al.

(10) Patent No.: US 10,522,659 B2
(45) Date of Patent: Dec. 31, 2019

(54) ARRAY SUBSTRATE AND DISPLAY PANEL INCLUDING THE SAME

(71) Applicant: LG DISPLAY CO., LTD., Seoul (KR)

(72) Inventors: Hyunsoo Lim, Gyeonggi-do (KR);
KangJu Lee, Gyeonggi-do (KR);
Sookang Kim, Gyeonggi-do (KR);
Wonhoe Koo, Gyeonggi-do (KR);
Jihyang Jang, Gyeonggi-do (KR);
Mingeun Choi, Chungcheongnam-do (KR)

(73) Assignee: LG Display Co., Ltd., Seoul (KR)

(*) Notice: Subject to any disclaimer, the term of this patent is extended or adjusted under 35 U.S.C. 154(b) by 0 days.

(21) Appl. No.: 16/035,249

(22) Filed: Jul. 13, 2018

(65) Prior Publication Data
US 2018/0323286 A1 Nov. 8, 2018

Related U.S. Application Data

(63) Continuation of application No. 15/638,840, filed on Jun. 30, 2017, now Pat. No. 10,050,127.

(30) Foreign Application Priority Data

Jun. 30, 2016 (KR) ........................ 10-2016-0083117

(51) Int. Cl.
*H01L 29/66* (2006.01)
*G02F 1/1333* (2006.01)
*G02F 1/1335* (2006.01)
*G02F 1/1343* (2006.01)
*G02F 1/1362* (2006.01)
(Continued)

(52) U.S. Cl.
CPC ...... *H01L 29/66765* (2013.01); *G02F 1/1362* (2013.01); *G02F 1/133345* (2013.01); *G02F 1/133514* (2013.01); *G02F 1/134309* (2013.01); *H01L 25/0753* (2013.01); *H01L 27/12* (2013.01); *H05B 33/0803* (2013.01); *H05B 33/0821* (2013.01)

(58) Field of Classification Search
CPC ............... H01L 29/66765; H01L 27/12; H01L 25/0753; G02F 1/133514; G02F 1/133345; G02F 1/134309; G02F 1/1362; H05B 33/0821; H05B 33/0803
See application file for complete search history.

(56) References Cited

U.S. PATENT DOCUMENTS

| | | | | |
|---|---|---|---|---|
| 2015/0380466 A1* | 12/2015 | Koo | ................... | H01L 27/3258 257/40 |
| 2016/0033816 A1* | 2/2016 | Yoon | ................. | G02F 1/133512 349/108 |
| 2016/0363821 A1* | 12/2016 | Lee | ................... | G02F 1/134309 |

* cited by examiner

*Primary Examiner* — Selim U Ahmed
(74) *Attorney, Agent, or Firm* — Morgan, Lewis & Bockius LLP (57) ABSTRACT

An array substrate for a display device is disclosed. The array substrate includes a substrate comprising a plurality of subpixels, at least one of which is a white subpixel. The array substrate also includes an insulating layer disposed on the substrate in each of the subpixels and a plurality of color filter layers disposed on the insulating layer, each of the color filter layers being disposed respectively in a corresponding one of the subpixels. At least two of the color filter layers have a same color and are respectively disposed in the white subpixel and in at least one of the subpixels adjacent to the white subpixel. The insulating layer has a slope at a boundary between the white subpixel and the at least one of the subpixels adjacent to the white subpixel.

20 Claims, 9 Drawing Sheets

(51) Int. Cl.
*H01L 25/075* (2006.01)
*H01L 27/12* (2006.01)
*H05B 33/08* (2006.01)

ARRAY SUBSTRATE AND DISPLAY PANEL INCLUDING THE SAME

CROSS REFERENCE TO RELATED APPLICATIONS

The present application a Continuation application of U.S. patent application Ser. No. 15/638,840, filed on Jun. 30, 2017, and also claims the benefit of and priority to Korean Patent Application No. 10-2016-0083117, filed in Korea on Jun. 30, 2016. Each of the above prior applications is hereby incorporated by reference for all purposes as if fully set forth herein.

BACKGROUND

Field

The present disclosure relates to an array substrate capable of lowering reflectance while simplifying processing, and a display device including the same.

Discussion of the Related Art

In response to the development of the information society, there has been an increasing demand for various types of display devices capable of displaying images. Recently, several types of display devices, such as liquid crystal display (LCD) devices, plasma display panels (PDPs), and organic light-emitting display (OLED) devices, have come into widespread use.

In a display device including white (W) subpixels, the reflectance of such white subpixels without color filter layers may be significantly higher than the reflectance of red (R), green (G), or blue (B) subpixels including color filter layers, thereby increasing the overall reflectance of the panel.

To overcome this problem, a structure in which a color filter layer is added to a white subpixel has been proposed. However, this may cause other potential problems. For example, an additional mask may be required to add the color filter layer on the white subpixels, the manufacturing processing may become more complicated, and the manufacturing costs may increase.

SUMMARY

Accordingly, the present disclosure relates to an array substrate and a display panel including the same that substantially obviate one or more of the problems due to limitations and disadvantages of the related art.

Various aspects of the present disclosure provide for an array substrate capable of lowering the reflectance of an organic light-emitting display device, simplifying the manufacturing process, and reducing the manufacturing costs, and a display panel including the same.

Additional features and advantages of the present disclosure will be set forth in the description which follows, and in part will be apparent from the description, or may be learned by practice of the disclosure. The objectives and other advantages of the present disclosure will be realized and attained by the example structures particularly pointed out in the written description and claims hereof as well as the appended drawings.

To achieve these and other advantages and in accordance with the purpose of the present disclosure, as embodied and broadly described, an array substrate for a display device includes: a substrate comprising a plurality of subpixels, at least one of which is a white subpixel; an insulating layer disposed on the substrate in each of the subpixels; and a plurality of color filter layers disposed on the insulating layer, each of the color filter layers being disposed respectively in a corresponding one of the subpixels, wherein at least two of the color filter layers have a same color and are respectively disposed in the white subpixel and in at least one of the subpixels adjacent to the white subpixel, and the insulating layer has a slope at a boundary between the white subpixel and the at least one of the subpixels adjacent to the white subpixel.

In another aspect, a display panel includes: a substrate comprising a plurality of subpixels, including at least first and second subpixels adjacent to each other and configured to provide different colors from each other; an insulating layer disposed on the substrate in each of the first and the second subpixels; and first and second color filter layers disposed on the insulating layer respectively in the first and the second subpixels, the first and the second color filter layers having a same color, wherein the insulating layer has a slope at a boundary between the first subpixel and the second subpixel.

It is to be understood that both the foregoing general description and the following detailed description are exemplary and explanatory, and are intended to provide further explanation of the invention without limiting it.

BRIEF DESCRIPTION OF THE DRAWINGS

The accompanying drawings, which are included to provide a further understanding of the disclosure and are incorporated in and constitute a part of this specification, illustrate example embodiments and together with the description serve to explain the principles of the disclosure. In the drawings.

DETAILED DESCRIPTION

Reference will now be made in detail to embodiments of the present disclosure, examples of which are illustrated in the accompanying drawings. The embodiments set forth herein are provided for illustrative purposes to fully convey the concept of the present disclosure to a person skilled in the art. The present invention should not be construed as being limited to these embodiments and may be embodied in many different forms. The scope of the present invention shall be defined by the appended Claims. In the drawings, the size and thickness of the device may be exaggerated for the sake of clarity. Throughout this document, the same reference numerals and symbols will be used to designate the same or like components.

It will be understood that, when an element or a layer is referred to as being "on" another element or layer, not only can it be "directly on" the other element or layer, but it can also be "indirectly on" the other element or layer via an "intervening" element or layer. In contrast, when an element or a layer is referred to as being "directly on" another element or layer, it will be understood that no intervening element or layer is interposed.

Spatially relative terms such as "below," "beneath," "under," "lower," "above," "over," and "upper" may be used herein for the ease of description of the relationship of an element or components to another element or other components as illustrated in the drawings. The spatially relative terms should be construed as terms encompassing different orientations of the element in use or operation in addition to the orientation depicted in the drawings. For example, when elements illustrated in the drawings are turned over, an element described as "below," "beneath," or "under" another element would then be oriented "above" or "over" the other element. Thus, the example term "below," "beneath," or "under" can encompass both orientations of above and below.

In addition, terms such as "first," "second," "A," "B," "(a)," and "(b)" may be used herein to describe the components. It should be understood, however, that these terms are merely used to distinguish one component from another component and do not define or limit the substance, order, sequence, or number of the components.

Figure 1:
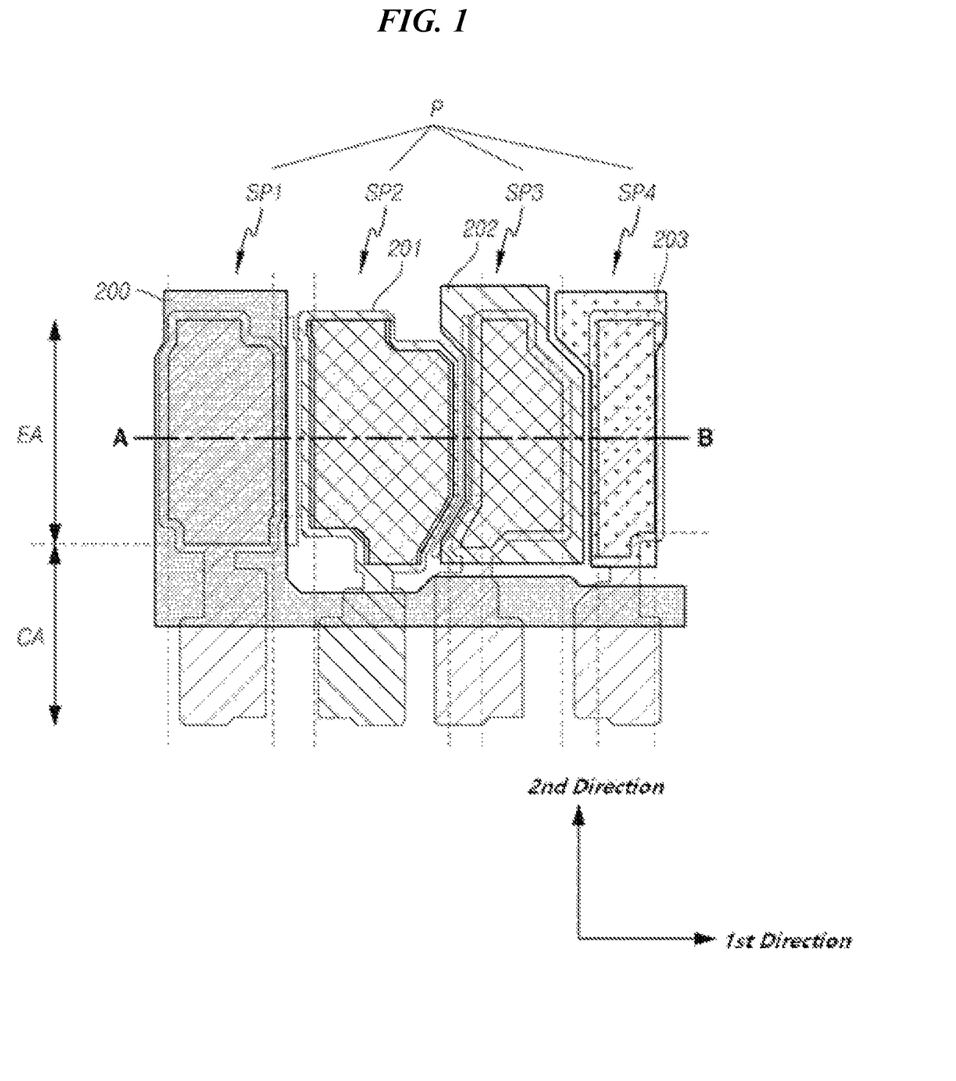
FIG. 1 is a plan view illustrating a portion of a display panel to which example embodiments may be applied.

FIG. 1 is a plan view illustrating a portion of a display panel to which example embodiments may be applied. As shown in FIG. 1, a single pixel P in the display panel may include a plurality of subpixels SP1, SP2, SP3, and SP4. The subpixels SP1, SP2, SP3, and SP4 may be defined in regions in which gate lines (not shown) extending in a first direction intersect data lines (not shown) extending in a second direction.

Specifically, a single pixel P may include a first subpixel SP1, a second subpixel SP2, a third subpixel SP3, and a fourth subpixel SP4. Here, at least one of the first to the fourth subpixels may be a subpixel from which white (W) light is emitted.

Although a configuration in which a single pixel P includes four subpixels SP1, SP2, SP3, and SP4 is illustrated in FIG. 1 as an example, the display panel according to example embodiments is not limited thereto. For example, a single pixel P may include two or three subpixels, or at least one subpixel from among a plurality of subpixels included in two or more adjacent pixels P, where at least one of subpixels may be a subpixel emitting white light. That is, example embodiments are applicable to any display panel including at least one subpixel emitting white light.

Hereinafter, a display panel in which the pixel P includes four subpixels SP1, SP2, SP3, and SP4 will mainly be described for the convenience of description, but as discussed above the display panel is not limited thereto. The four subpixels SP1, SP2, SP3, and SP4 of the pixel P will be referred to as a first subpixel SP1, a second subpixel SP2, a third subpixel SP3, and a fourth subpixel SP4. The subpixels SP1, SP2, SP3, and SP4 may generate different colors of light, respectively.

In addition, for ease of reference in the following example embodiments, the first subpixel SP1 will be described as a subpixel emitting red (R) light, the second subpixel SP2 will be described as a subpixel emitting white (W) light, the third subpixel SP3 will be described as a subpixel emitting blue (B) light, and the fourth subpixel SP4 will be described as a subpixel emitting green (G) light.

Each of the subpixels SP1, SP2, SP3, and SP4 may include an emission area EA and a circuit area CA. In an OLED panel, for example, an organic light-emitting diode (OLED) or an organic electroluminescent device is disposed in the emission area EA, and a circuit required for driving the OLED, for example, at least one thin-film transistor (TFT), is disposed in the circuit area CA. The display panel is not limited to an OLED panel and may be another type of display panel, such as an LCD panel.

Although the OLEDs disposed in the subpixels SP1, SP2, SP3, and SP4 may be white-light-emitting OLEDs, example embodiments are not limited thereto. For example, an OLED emitting red light (or a red OLED) may be disposed in the subpixel emitting red light, an OLED emitting green light (or a green OLED) may be disposed in the subpixel emitting green light, an OLED emitting blue light (or a blue OLED) may be disposed in the subpixel emitting blue light, and an OLED emitting white light may be disposed in the subpixel emitting white light.

Hereinafter, all of the OLEDs disposed in the subpixels SP1, SP2, SP3, and SP4 will mainly be described as OLEDs emitting white light for the convenience of description.

The emission areas of the subpixels SP1, SP2, SP3, and SP4 may have different sizes from one another. The sizes of the emission areas of the subpixels SP1, SP2, SP3, and SP4 may be adjusted in consideration of the color coordinates of the display panel, the lifespan of the OLEDs, and the like.

Color filter layers 200, 201, 202, and 203 may be disposed in the subpixels SP1, SP2, SP3, and SP4, respectively, to overlap the emission areas EA. Specifically, the first color filter layer 200 may be disposed in the first subpixel SP1, the second color filter layer 201 may be disposed in the second subpixel SP2, the third color filter layer 202 may be disposed in the third subpixel SP3, and the fourth color filter layer 203 may be disposed in the fourth subpixel SP4.

However, in the organic light-emitting display device including the white subpixels, no color filers may need to be disposed in the white subpixels. In the case of the white subpixels without the color filter layers, the reflectance of the white subpixels may be significantly higher than the reflectance of each or at least one of the red, green, and blue subpixels including the color filter layers. This may consequently increase the reflectance of the panel. Although a white color filter layer may be disposed in the white subpixel to overcome this problem, an additional masking process would be employed to provide the white color filter layer, thereby increasing the fabrication time and cost of the display panel.

In the organic light-emitting display device including the white subpixels, example embodiments provide an organic light-emitting display device capable of lowering reflectance while simplifying the manufacturing process.

Specifically, as illustrated in FIG. 1, the second color filter layer 201 may be disposed in the second subpixel SP2 emitting white light. Here, the second color filter layer 201 may have the same color as a color filter layer disposed in another subpixel adjacent to the second subpixel SP2.

For example, the second color filter layer 201 may have the same color as the first color filter layer 200 disposed in the first subpixel SP1 or the third color filter layer 202 disposed in the third pixel SP3, which is adjacent to the second subpixel SP2. This can consequently reduce the reflectance of the second subpixel SP2 without complicating the manufacturing process or increasing the manufacturing cost. Here, the thickness of the second color filter layer 201 may be smaller than the thickness of one or more of the first color filter layer 200, the third color filter layer 202, and the fourth color filter layer 203.

In a display panel according to a first example embodiment, the second color filter layer 201 is disclosed as having the same color as the third color filter layer 202 disposed in the third subpixel SP3. In this example embodiment, the second color filter layer 201 is disclosed as being thinner than each of the first, the third, and the forth color filters SP1, SP3, and SP4.

Although the second color filter layer 201 is thinner than the third color filter layer 202, the distance between a top surface of the second color filter layer 201 and the top surface of a substrate 100 of a display panel (see FIG. 2) may be substantially equal to the distance between a top surface of the third color filter layer 202 and the top surface of the substrate 100. This allows the second color filter layer 201 and the third color filter layer 202 to be formed in the same manufacturing process, thereby simplifying the process.

Figure 2:
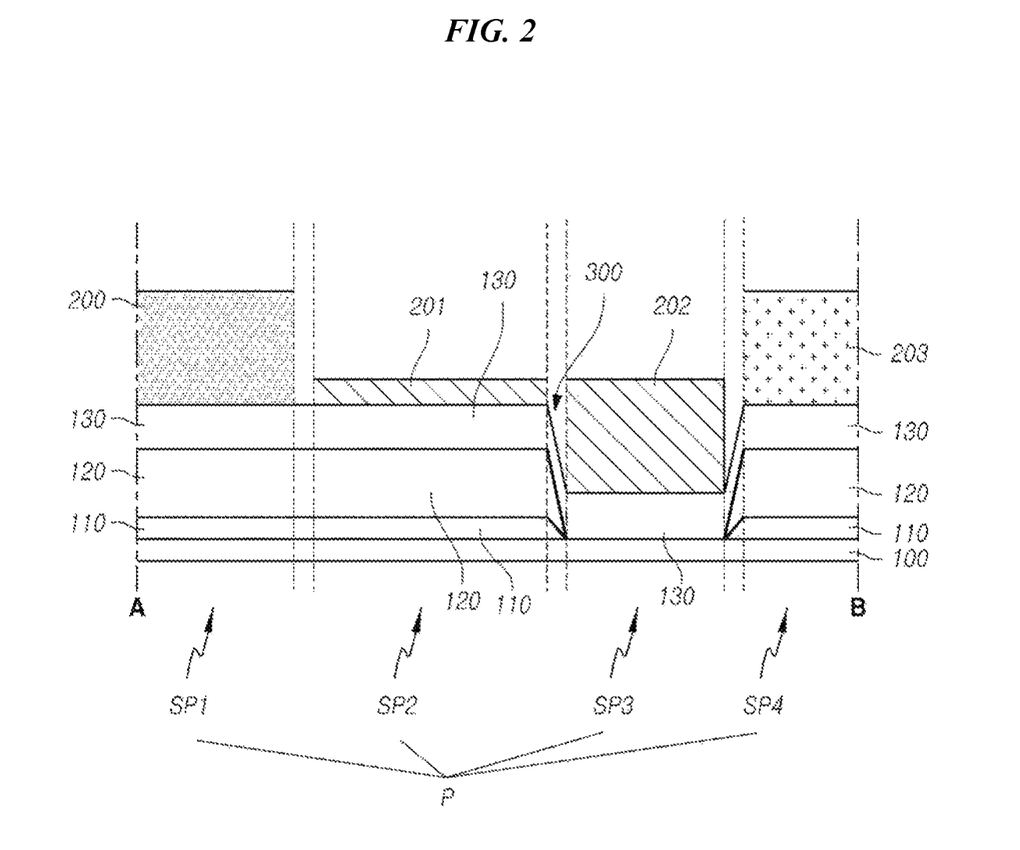
FIG. 2 is a cross-sectional view taken along line A-B in FIG. 1, illustrating a portion of a display panel according to a second example embodiment.

This configuration will be described in more detail with reference to FIG. 2. FIG. 2 is a cross-sectional view taken along line A-B in FIG. 1.

As shown in FIG. 2, in the display panel according to the first example embodiment, a substrate 100 is divided into a plurality of subpixels SP1, SP2, SP3, and SP4. An insulating layer including at least one of layers 110, 120, and 130 may be disposed on the substrate 100. Specifically, in the display panel according to the first example embodiment, the layers 110, 120, and 130 of the insulating layer or the multilayer insulating layer 110, 120, and 130 may include a buffer 110, a gate dielectric 120, and an interlayer dielectric 130. In the subpixels SP1, SP2, SP3, and SP4, the color filter layers 200, 201, 202, and 203 may be disposed on the insulating layer 110, 120, and/or 130. One or more of the layers 110, 120, and 130 may be disposed in some but not all of the subpixels SP1, SP2, SP3, and SP4. For example, as shown in FIG. 2, layers 110 and 120 may be disposed in the subpixels SP1, SP2, and SP4 without being disposed in the subpixel SP3.

The thickness of the insulating layer disposed in at least one of the subpixels SP1, SP2, SP3, and SP4 of a single pixel P may differ from the thickness of the insulating layer disposed in each of the remaining subpixels. The thicknesses of the insulating layer in the subpixels SP1, SP2, SP3, and SP4 may be determined based on distances to the color filter layers 200, 201, 202, and 203, respectively, from the top surface of the substrate 100.

Specifically, the thickness of the insulating layer disposed in at least one of the subpixels SP1, SP2, SP3, and SP4 may be smaller than the thickness of the insulating layer disposed in each of the remaining subpixels.

More specifically, the thickness of the insulating layer disposed in at least one of the subpixels disposed adjacent to the second subpixel SP2 may be smaller than the thickness of the insulating layer disposed in each of the remaining subpixels. For example, the thickness of the insulating layer 130 disposed in the third subpixel SP3 may be smaller than the thickness of the multilayer insulating layer 110, 120, and 130 disposed in the first subpixel SP1, the second subpixel SP2, and the fourth subpixel SP4.

Here, the insulating layer disposed in each of the first subpixel SP1, the second subpixel SP2, and the fourth subpixel SP4 has at least one more layer than the insulating layer disposed in the third subpixel SP3, such that the thickness of the multilayer insulating layer 110, 120, and 130, disposed in the first subpixel SP1, the second subpixel SP2, and the fourth subpixel SP4, is greater than the thickness of the insulating layer 130 disposed in the third subpixel SP3.

In the display panel according to the first example embodiment, only the interlayer dielectric 130 is disposed on the substrate 100, in the third subpixel SP3 in the area corresponding to the area in which the third color filter layer is to be disposed. In addition, in the first subpixel SP1, the second subpixel SP2, and the fourth subpixel SP4 in the areas corresponding to the areas in which the first, second, and fourth color filter layers are to be respectively disposed, the buffer 110, the gate dielectric 120, and the interlayer dielectric 130 are sequentially disposed on the substrate 100. The buffer 110, the gate dielectric 120, and the interlayer dielectric 130 may have different thicknesses from one another.

When the third subpixel SP3 is compared with the other subpixels, neither the buffer 110 nor the gate dielectric 120 is disposed. Thus, the thickness of the insulating layer 130 disposed in the third subpixel SP3 differs from the thickness of the multilayer insulating layer 110, 120, and 130 disposed in the remaining subpixels by an amount equal to the thickness of the buffer 110 and the gate dielectric 120.

As described above, the thickness of the insulating layer 130 of the third subpixel SP3 disposed adjacent to the second subpixel SP2 is smaller than the thickness of the multilayer insulating layer 110, 120, and 130 disposed in the second subpixel SP2, such that the single pixel P may have at least one slope 300 in the insulating layer. Specifically, the slope 300 may be formed on the insulating layer disposed on the substrate 100, at the boundary between the second subpixel SP2 and the third subpixel SP3.

In the subpixels SP1, SP2, SP3, and SP4, the color filter layers 200, 201, 202, and 203 are respectively disposed on the insulating layer 110, 120, and/or 130. Specifically, in the first subpixel SP1, the second subpixel SP2, and the fourth subpixel SP4, the first color filter layer 200, the second color filter layer 201, and the fourth color filter layer 203 are each disposed on the buffer 110, the gate dielectric 120, and the interlayer dielectric 130. In the third subpixel SP3, the third color filter 202 is disposed on the interlayer dielectric 130.

Here, the thickness of the insulating layer 130 disposed in the third subpixel SP3 is smaller than the thickness of the multilayer insulating layer 110, 120, and 130 commonly disposed in the first subpixel SP1, the second subpixel SP2, and the fourth subpixel SP4, such that the distance between the bottom surface of the third color filter layer 202 and the top surface of the substrate 100 may be shorter than the distance between the bottom surface of each of the first color filter layer 200, the first color filter layer 201, and the fourth color filter layer 203 and the top surface of the substrate 100.

In the display panel according to the first example embodiment, the second color filter layer 201 and the third color filter layer 202 may have the same color. Thus, the second color filter layer 201 and the third color filter layer 202 may be formed in the same manufacturing process.

Specifically, the process of forming the second color filter layer 201 and the third color filter layer 202 may include applying an organic material, a component of the second color filter layer 201 and the third color filter layer 202, to the substrate 100, followed by exposure, development, and curing. In the process of applying the organic material of the second color filter layer 201 and the third color filter layer 202, the organic material may be applied to areas corresponding to areas in which the second color filter layer 201 and the third color filter layer 202 are to be disposed.

Here, the applied organic material may be a fluidic material. When the organic material is applied to the areas corresponding to the areas in which the second color filter layer 201 and the third color filter layer 202 are to be disposed, at least one slope 300 is provided in the insulating layer disposed on the substrate 100, at the boundary between the second subpixel SP2 and the third subpixel SP3, such that a portion of the applied organic material can flow along the slope 300.

Specifically, the organic material of the second color filter layer 201 and the third color filter layer 202 is applied to the second subpixel SP2 and the third subpixel SP3. In addition, since the thickness of the insulating layer 130 disposed in the third subpixel SP3 is smaller than the thickness of the multilayer insulating layer 110, 120, and 130 disposed in the second subpixel SP2, a portion of the organic material applied on the multilayer insulating layer 110, 120, and 130 disposed in the second subpixel SP2 may flow to the third subpixel SP3. Subsequently, the organic material applied to the second subpixel SP2 and the third subpixel SP3 may be exposed, developed, and cured, thereby forming the second color filter layer 201 and the third color filter layer 202 respectively in the second and the third subpixels SP2 and SP3.

Although the second color filter layer 201 and the third color filter layer 202 are illustrated as being separated at the boundary between the subpixels in FIG. 2, example embodiments are not limited thereto. For example, example embodiments may include a configuration in which the second color filter layer 201 and the third color filter layer 202 are connected at the boundary between the second and the third subpixels SP2 and SP3. As illustrated in FIG. 2, in the configuration in which the second color filter layer 201 and the third color filter layer 202 are separated at the boundary between the subpixels, the two color filter layers can be separated by patterning the boundary between the second color filter layer 201 and the third color filter layer 202 when patterning the cured organic material to form the second and the third color filter layers 201, 202 disposed respectively in the second and the third subpixels SP2, SP3.

A portion of the organic material applied in the second subpixel SP2 flows to the third subpixel SP3, so that the thickness of the second color filter layer 201 finally formed in the second subpixel SP2 may be smaller than the thickness of the third color filter layer 202 finally formed in the third subpixel SP3.

Specifically, the thickness of the third color filter layer 202 may range from 0.5 µm to 3 µm, and the thickness of the second color filter layer 201 may be smaller than the thickness of the third color filter layer 202. If the thickness of the third color filter layer 202 is less than 0.5 µm, the color purity of light emitted by the third subpixel SP3 may be reduced. In addition, if the thickness of the third color filter layer 202 exceeds 3 µm, the process of forming the third color filter layer 202 may be difficult.

The second color filter layer 201 and the third color filter layer 202 may be formed in the same process. That is, the different thicknesses of the second color filter layer 201 and the third color filter layer 202 can be adjusted using the slope 300 formed due to the adjustment of the thickness of the insulating layer 110, 120, and/or 130 in the second and the third subpixels SP2, SP3, respectively.

Figure 3:
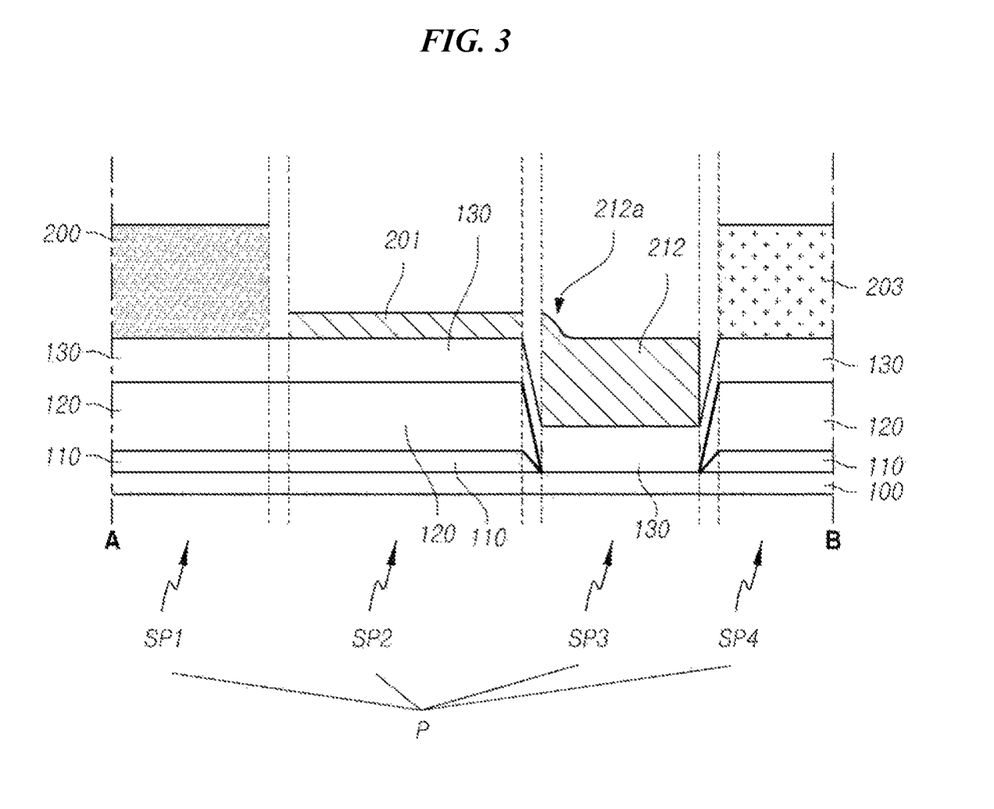
FIG. 3 is a cross-sectional view illustrating another shape of a third color filter layer according to a first example embodiment.

The shape of the third color filter layer 202 of the display panel according to the first example embodiment is not limited to the shape illustrated in FIG. 2 and may have a shape as illustrated in FIG. 3, or a similar shape in which the thickness of the second color filter layer 201 is smaller than the thickness of the third color filter layer 202.

FIG. 3 illustrates another shape of the third color filter layer according to the first example embodiment. As shown in FIG. 3, a stepped portion 212a may be formed in at least one portion of a third color filter layer 212 disposed on the insulating layer 130 in the third subpixel SP3, where the thickness of the insulating layer 130 is smaller than the thickness of the multilayer insulating layer at least in the second subpixel SP2.

Although one possible configuration in which the stepped portion 212a is provided in a portion of the third color filter layer 212 is illustrated in FIG. 3, example embodiments are not limited thereto. The third color filter layer 212 may have two or more stepped portions in two or more portions near the boundaries of the third subpixel SP3.

In the process of forming the second color filter layer 201 and the third color filter layer 212, the organic material of the second color filter layer 201 and the third color filter layer 212 may flow from the second subpixel SP2 to the third subpixel SP3. Thus, in the area of the third subpixel SP3 adjacent to the second subpixel SP2, the stepped portion 212a may be provided in one portion of the third color filter layer 212.

The above-described shape of the third color filter layer 212 may be obtained by forming the second color filter layer 201 and the third color filter layer 212 in the same process by adjusting the thickness and/or presence of the insulating layer 110, 120, and 130 respectively in the second subpixel SP2 and the third subpixel SP3.

Figure 4:
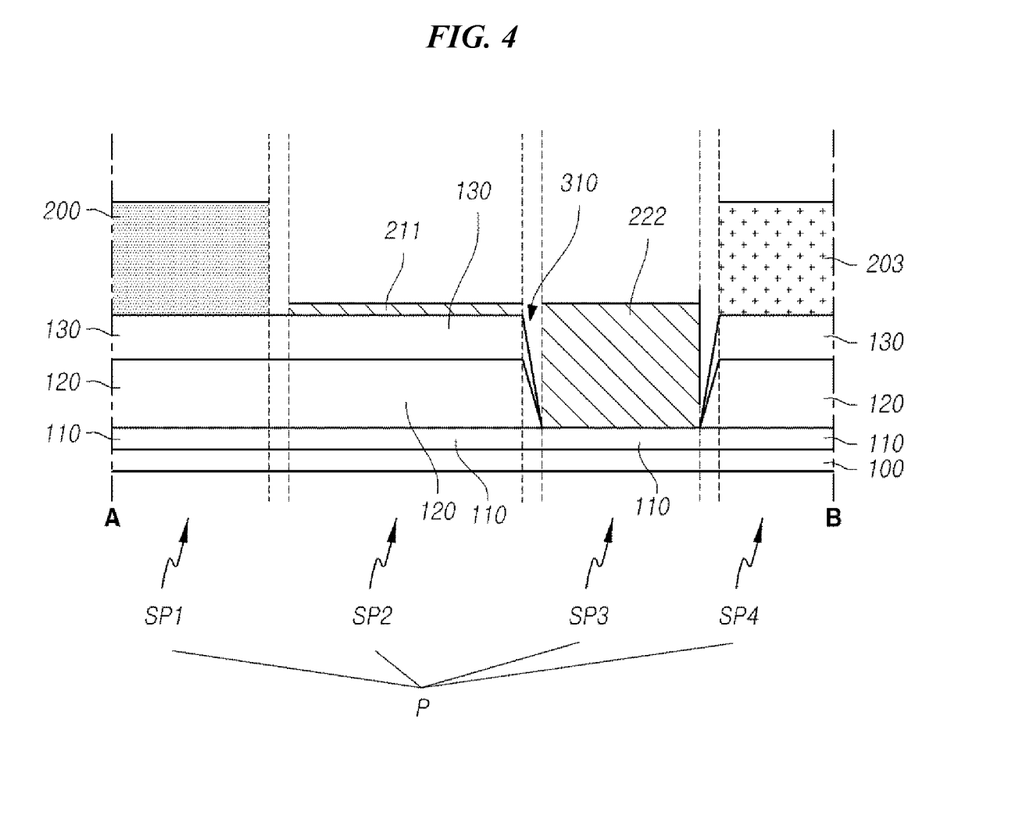
FIG. 4 is a cross-sectional view along line A-B in FIG. 1, illustrating a portion of a display panel according to a second example embodiment.

Hereinafter, a display panel according to a second example embodiment will be described with reference to FIG. 4. FIG. 4 is a cross-sectional view illustrating a portion of the display panel according to the second example embodiment. The display panel according to the second example embodiment may include the same or similar components as in the above-described example embodiment. Descriptions of some components and functions are not repeated where they are identical to the description of those components and functions in the example embodiments discussed above. In addition, the same reference numerals and symbols will be used to designate the same or like components.

As shown in FIG. 4, in the display panel according to the second example embodiment, the thickness of the insulating layer 110 disposed in a third subpixel SP3 adjacent to a second subpixel SP2 may be smaller than the thickness of the multilayer insulating layer 110, 120, and 130 disposed in the second subpixel SP2. Specifically, a buffer 110, a gate dielectric 120, and an interlayer dielectric 130 are sequentially disposed on a substrate 100 in the second subpixel SP2. In contrast, only the buffer 110 is disposed on the substrate 100 in the third subpixel SP3.

That is, if the thickness of the insulating layer in the second subpixel SP2 is compared with the thickness of the insulating layer in the third subpixel SP3, the thickness of the insulating layer 110 disposed in the third subpixel SP3 may be smaller than the thickness of the multilayer insulating layer 110, 120, and 130 disposed in the second subpixel SP2 by an amount equal to the combined thickness of the gate dielectric 120 and the interlayer dielectric 130.

A slope 310 may be provided in the insulating layer at the boundary between the second subpixel SP2 and the third subpixel SP3, due to the difference in thickness between the insulating layer in the second subpixel SP2 and the insulating layer in the third subpixel SP3.

In the display panel according to example embodiments, in a case in which the thickness of the buffer 110 is smaller than the thickness of the interlayer dielectric 130, the inclination of the slope 310 according to the second example embodiment may be greater than the inclination of the slope 300 according to the first example embodiment.

Thus, the thickness of a second color filter layer 211 in the second example embodiment, as illustrated for example in FIG. 4, may be smaller than the thickness of the second color filter layer 201 in the first example embodiment, as illustrated for example in FIG. 2. Additionally or alternatively, the thickness of a third color filter layer 222 in the second example embodiment, as illustrated for example in FIG. 4, may be greater than the thickness of the third color filter layer 202 in the first example embodiment, as illustrated for example in FIG. 2.

Since the inclination of the slope 310 according to the second example embodiment may be greater than the inclination of the slope 300 according to the first example embodiment, more of an organic material of the second color filter layer 211 and the third color filter layer 212 according to the second example embodiment may flow along the slope 310 to the insulating layer 110 disposed in the third subpixel SP3.

Thus, the thickness of the second color filter layer 211 according to the second example embodiment may be smaller than the thickness of the second color filter layer 211 according to the first example embodiment, and/or the thickness of the third color filter layer 222 according to the second example embodiment may be greater than the thickness of the third color filter layer 202 according to the first example embodiment.

That is, the inclination of the slope 310 of the insulating layer disposed in the second subpixel SP2 and the third subpixel SP3 may be changed by adjusting the thickness of the insulating layer 110 in the third subpixel SP3 adjacent to the second subpixel SP2 or the thickness or presence of one or more of the buffer 110, the gate dielectric 120, and the interlayer dielectric 130 in the second subpixel SP2. As described above, in the process of forming the second color filter layer 211 and the third color filter layer 222 by changing the inclination of the slope, it is possible to adjust the amount of flow or the flow rate of the organic material of the second color filter layer 211 and the third color filter layer 222, and thereby adjust the thickness of the second color filter layer 211 and the thickness of the third color filter layer 222.

Figure 5:
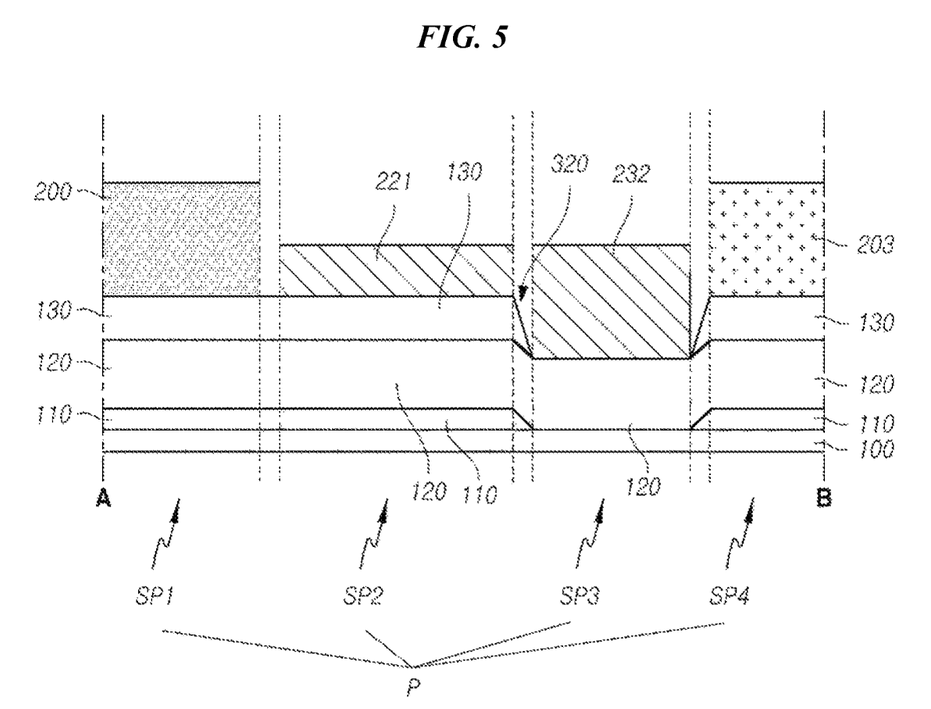
FIG. 5 is a cross-sectional view along line A-B in FIG. 1, illustrating a portion of a display panel according to a third example embodiment.

Hereinafter, a display panel according to a third example embodiment will be described with reference to FIG. 5. FIG. 5 is a cross-sectional view illustrating a portion of the display panel according to the third example embodiment. The display panel according to the third example embodiment may include the same components as described in the above-described example embodiments. Descriptions of some components and functions are not repeated where they are identical to the description of those components and functions in any of the example embodiments discussed above. In addition, the same reference numerals and symbols will be used to designate the same or like components.

As shown in FIG. 5, in the display panel according to the third embodiment, the thickness of the insulating layer 120 disposed in a third subpixel SP3 adjacent to a second subpixel SP2 may be smaller than the thickness of the multilayer insulating layer 110, 120, 130 disposed in the second subpixel SP2. Specifically, in the second subpixel SP2, the buffer 110, the gate dielectric 120, and the interlayer dielectric 130 are sequentially disposed on the substrate 100. In contrast, in the third subpixel SP3, only the gate dielectric 120 is disposed on the substrate 100.

Due to the difference in thickness between the insulating layer disposed in the second subpixel SP2 and the insulating layer disposed in the third subpixel SP3, a slope 320 is provided in a portion of the insulating layer at the boundary between the second subpixel SP2 and the third subpixel SP3.

In the display panel according to example embodiments, when the thickness of the gate dielectric 120 is greater than the thickness of the buffer 110 and the interlayer dielectric 130, the inclination of the slope 320 according to the third example embodiment may be smaller than the inclination of each of the slopes 300 and 310 according to the first and second example embodiments.

Thus, the thickness of a second color filter layer 221 illustrated in FIG. 5 may be greater than the thickness of each of the second color filter layers 201 and 211 illustrated respectively in FIGS. 2 and 4. In addition, the thickness of the third color filter layer 202 illustrated in FIG. 2 may be greater than the thickness of the third color filter layer 222 illustrated in FIG. 4.

Since the inclination of the slope 320 in the third example embodiment may be smaller than the inclination of each of the slopes 300 and 310 according to the first and second example embodiments, a smaller amount of the organic material of the second color filter layer 221 and a third color filter layer 232 according to the third example embodiment may flow along the slope 320 onto the insulating layer 120 disposed in the third subpixel SP3, compared with the first and second example embodiments.

Thus, the thickness of the second color filter layer 221 according to the third example embodiment may be greater than the thickness of each of the second color filter layers 201 and 211 according to the first and second example embodiments, and/or the thickness of the third color filter layer 232 may be smaller than the thickness of each of the third color filter layers 202 and 222 according to the first and second example embodiments.

As described above, in the process of forming the second color filter layer 221 and the third color filter layer 232 by changing the inclination of the slope 320, it is possible to adjust the amount of flow of the organic material of the second color filter layer 221 and the third color filter layer 232, and thereby adjust the thicknesses of the second color filter layer 221 and the third color filter layer 232.

Figure 6:
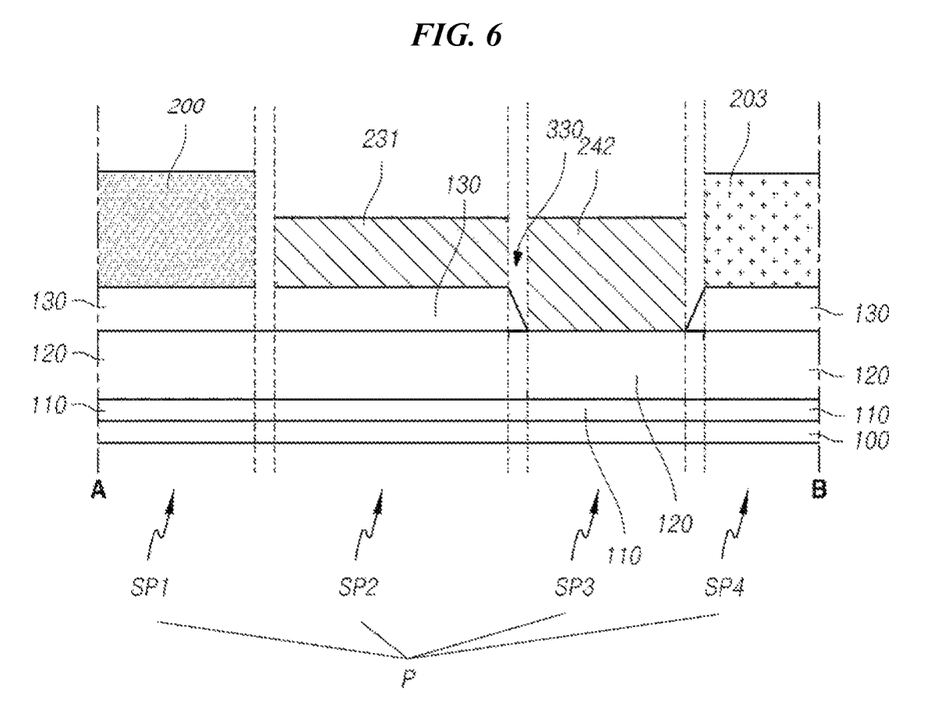
FIG. 6 is a cross-sectional view along line A-B in FIG. 1, illustrating a portion of a display panel according to a fourth example embodiment.

The configuration of the display panel according to example embodiments is not limited to the above-described configurations, and other configurations may be employed. For example, a configuration illustrated in FIG. 6 may be employed. FIG. 6 is a cross-sectional view illustrating a portion of a display panel according to a fourth example embodiment. The display panel according to the fourth embodiment may include the same or similar components as in the above-described example embodiments. Descriptions of some components and functions are not repeated where they are identical to the description of those components and function in any of the example embodiments discussed above. In addition, the same reference numerals and symbols are used to designate the same or like components.

As shown in FIG. 6, in the display panel according to the fourth example embodiment, the thickness of the multilayer insulating layer 110 and 120 disposed in a third subpixel SP3 adjacent to a second subpixel SP2 may be lower than the thickness of the multilayer insulating layer 110, 120, and 130 disposed in the second subpixel SP2. Specifically, a buffer 110, a gate dielectric 120, and an interlayer dielectric 130 may be sequentially disposed on a substrate 100 in the second subpixel SP2. In contrast, only the buffer 110 and the gate dielectric 120 may be disposed on the substrate 100 in the third subpixel SP3.

Although a configuration in which the buffer 110 and the gate dielectric 120 are sequentially disposed on the substrate 100 in the third subpixel SP3 is illustrated in FIG. 6, example embodiments are not limited thereto. For example, in the third subpixel SP3, the buffer 110 and the interlayer dielectric 130 may be sequentially disposed on the substrate 100, or the gate dielectric 120 and the interlayer dielectric 130 may be sequentially disposed on the substrate 100.

The thickness of the multilayer insulating layer 110 and 120 disposed in the third subpixel SP3 may be greater than the thickness of each of the insulating layers in the third subpixel SP3 according to the first to the third example embodiments. Thus, the inclination of the slope 330 of the insulating layer at the boundary between the second subpixel SP2 and the third subpixel SP3 according to the fourth example embodiment may be smaller than the inclination of each of the slopes 300, 310, and 320 according to the first to the third example embodiments.

Thus, the thickness of the second color filter layer 231 according to the fourth example embodiment may be greater than the thickness of each of the second color filter layers 201, 211, and 221 in the first to the third example embodiments. Additionally or alternatively, the thickness of the third color filter layer 242 according to the fourth example embodiment may be smaller than the thickness of each of the third color filter layers 202, 222, and 232 in the first to the third example embodiments.

As described above with respect to the first to the fourth example embodiments, the thickness of the insulating layer disposed under the third color filter layer in the third subpixel SP3 adjacent to the second subpixel SP2 may be smaller than the thickness of the insulating layer disposed under the second color filter layer in the second subpixel SP2. It is thereby possible to reduce the thickness of the second color filter layer to be smaller than the thickness of the third color filter layer in the same process.

In the display panel according to the first to the fourth example embodiments, it is possible to change the inclination of the slope of the insulating layer at the boundary between the second subpixel SP2 and the third subpixel SP3 by adjusting the thickness of the insulating layer disposed under the third color filter layer. This makes it possible to control the flow rate or the amount of flow of the organic material, thereby adjusting the thickness of the second color filter layer and/or the thickness of the third color filter layer.

In the second subpixel SP2 according to the first to the fourth embodiments, the thickness of the insulating layer disposed under the second color filter layer may be greater than the thickness of the insulating layer disposed under the color filter layer of at least one subpixel adjacent to the second subpixel SP2. Thus, the thickness of the color filter layer disposed in the second subpixel SP2 may be smaller than the thickness of the color filter layer disposed in the at least one subpixel adjacent to the second subpixel SP2. Specifically, since the thickness of the insulating layer of the second subpixel SP2 may be greater than the thickness of the insulating layer disposed in the at least one subpixel adjacent to the second subpixel SP2, during the process of forming the color filter layers, the organic material applied to the second subpixel SP2 may flow to the at least one adjacent subpixel. Thus, the thickness of the color filter layer finally formed in the second subpixel SP2 may be smaller than the thickness of the color filter layer disposed in one or more of the subpixels adjacent to the second subpixel SP2.

Since the thickness of the color filter layer disposed in the second subpixel SP2 may be smaller than the thickness of the color filter layer disposed in one or more of the other subpixels, it is possible to reduce the reflectance of the display panel without reducing the luminous efficiency of the display panel.

Specifically, when the second color filter layer is intended to be thick, for example, to help prevent or alleviate the high reflectance of the second subpixel SP2, or when the reflectance of the second subpixel SP2 is intended to be further reduced, the flow rate or the amount of flow of the organic material can be adjusted by reducing the inclination of the slope of the insulating layer at the boundary between the second subpixel SP2 and an adjacent subpixel, for example, the third subpixel SP3. Since the amount of the organic material, used for manufacturing the second and third color filter layers, flowing along the slope to the third subpixel SP3 is decreased, the thickness of the resultant second color filter layer can be increased. However, the thickness of the resultant second color filter layer would still be smaller than the thickness of the third color filter layer.

In addition, when the second color filter layer is intended to be thin, for example, to help prevent the efficiency of the second subpixel SP2 from becoming too low due to the second color filter layer, it is possible to increase the flow rate or the amount of flow of the organic material by increasing the inclination of the slope of the insulating layer at the boundary between the second subpixel SP2 and an adjacent subpixel, for example, the third subpixel SP3. Since the amount of the organic material, used for manufacturing the second and third color filter layers, flowing to the third subpixel SP3 along the slope is increased, the thickness of the resultant second color filter layer can be decreased.

Although the various configurations of adjusting the thickness of the insulating layer disposed in the third subpixel SP3 adjacent to the second subpixel SP2 are described above with respect to the first to the fourth example embodiments, example embodiments are not limited thereto and other configurations may be adopted. For example, an example configuration illustrated in FIG. 7 may be employed that utilize a different subpixel adjacent to the second subpixel SP2.

Figure 7:
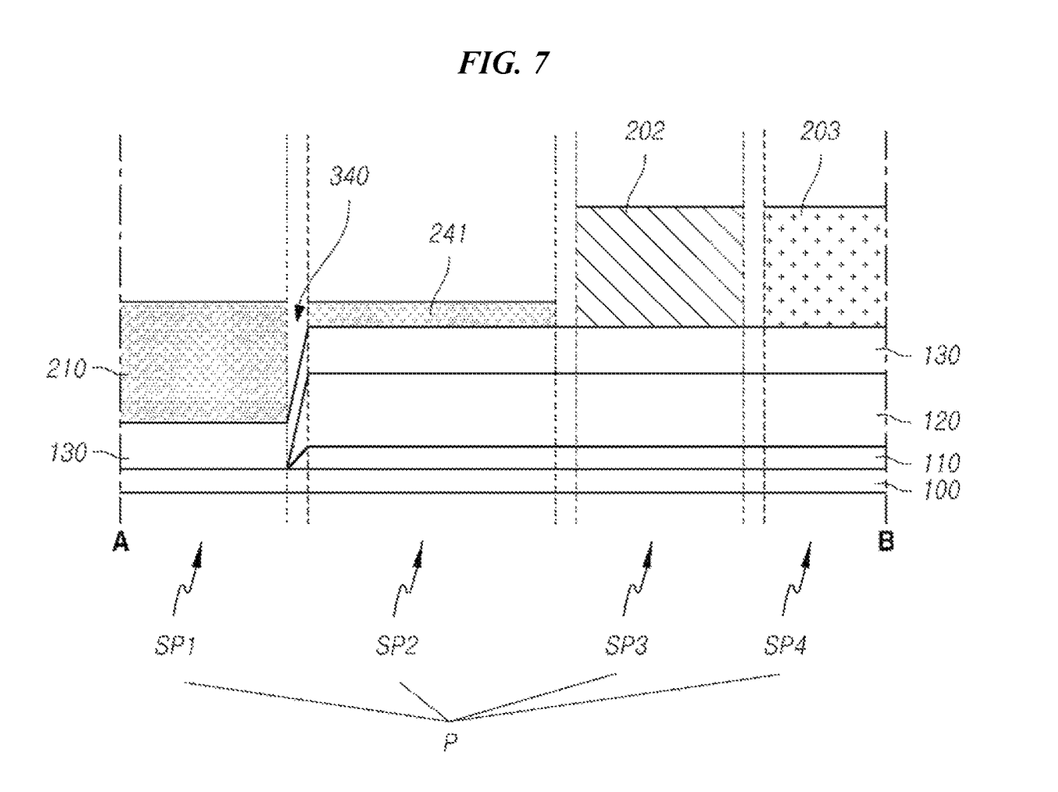
FIG. 7 is a cross-sectional view along line A-B in FIG. 1, illustrating a portion of a display panel according to a fifth example embodiment.

FIG. 7 is a cross-sectional view illustrating a portion of a display panel according to a fifth example embodiment. The display panel according to the fifth example embodiment may include some of the same or similar components as in the above-described example embodiments. Descriptions of some components and functions are not repeated where they are identical to the description of those components and functions of any of the example embodiments discussed above. In addition, the same reference numerals and symbols are used to designate the same or like components.

As shown in FIG. 7, in the display panel according to the fifth example embodiment, the thickness of the insulating layer 130 disposed in the first subpixel SP1 adjacent to the second subpixel SP2 may be smaller than the thickness of the multilayer insulating layer 110, 120, and 130. That is, the thickness of the insulating layer 130 disposed under the first color filter layer 210 may be smaller than the thickness of the multilayer insulating layer 110, 120, and 130 disposed under the second color filter layer 241. Thus, the insulating layer may have a slope 340 at the boundary between the first subpixel SP1 and the second subpixel SP2.

In the display panel according to the fifth example embodiment, the first color filter layer 210 and the second color filter layer 241 may have the same color. Since the slope 340 is provided at the boundary between the first subpixel SP1 and the second subpixel SP2, the organic material of the first color filter layer 210 and the second color filter layer 241 can flow along the slope 340 to the first subpixel SP1. Thus, a separate process for forming the second color filter layer 241 and adjusting the thickness of the color filter layer 241 can be omitted.

In addition to the configuration shown in FIG. 7, various other configurations of the insulating layer in the first subpixel SP1 and of the slope at the boundary between the first and second subpixels SP1 and SP2 may be employed. For example, the example configurations relating to the insulating layer in the third subpixel SP3 and the slope at the boundary between the second and third subpixels SP2 and SP3 as discussed above with respect to the first to the fourth example embodiments are similarly applicable to the insulating layer in the first subpixel SP1 where the same organic material is used to form the first color filter layer 210 and the second color filter layer 241.

The display panel according to example embodiments can be applied to an organic light-emitting display panel including OLEDs or organic electroluminescent devices. For example, example embodiments can be applied to an organic light-emitting display panel in which a light-scattering layer is provided in the subpixels SP1, SP2, SP3, and SP4 to improve the light extraction efficiency of an organic light-emitting display device. Hereinafter, such an example configuration will be discussed with reference to FIG. 8.

Figure 8:
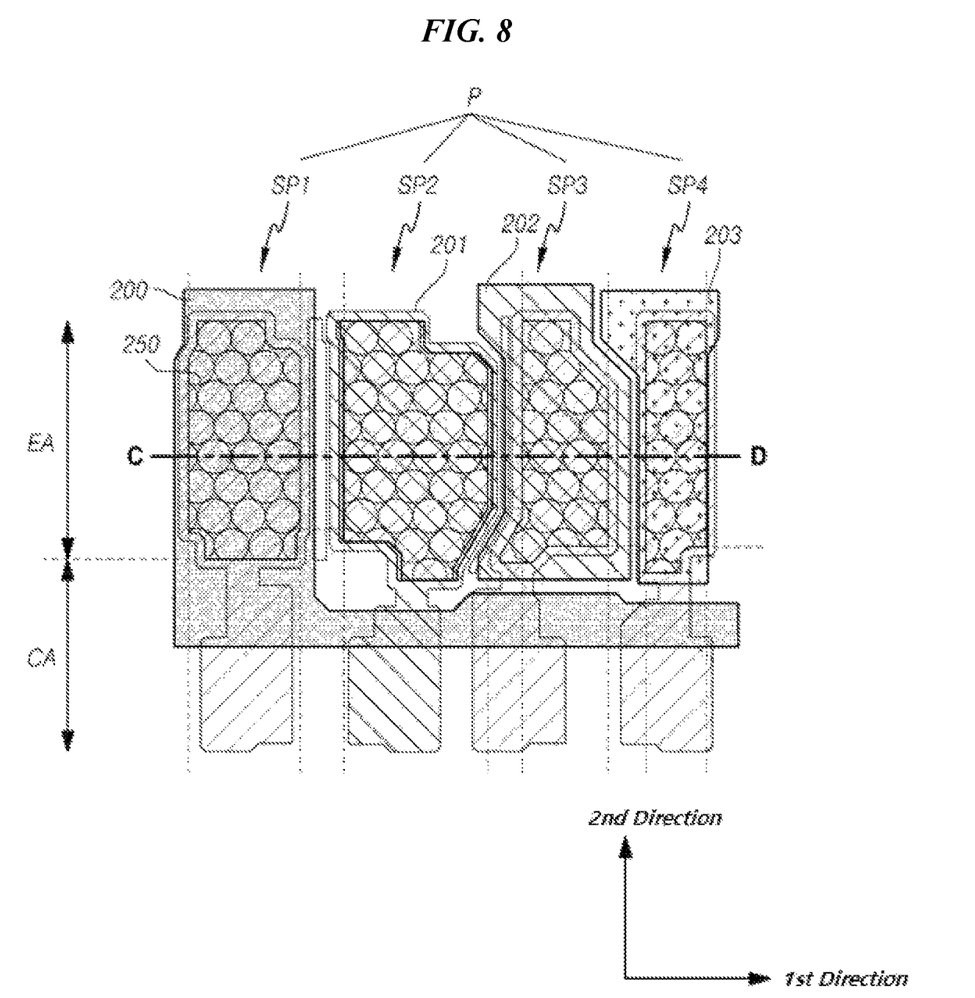
FIG. 8 is a plan view illustrating a portion of an organic light-emitting display panel having a scattering layer to which the display panel according to example embodiments, including the first to the fifth example embodiments, may be applied.

FIG. 8 is a plan view illustrating a portion of an organic light-emitting display panel having a scattering layer to which the display panel according to example embodiments is applied. The organic light-emitting display panel may include the same or similar components as described in any of the example embodiments discussed above. Descriptions of some components and functions are not repeated where they are identical to the description of those same components and functions in any of the example embodiments discussed above. In addition, the same reference numerals and symbols are used to designate the same or like components.

As shown in FIG. 8, the display panel according to example embodiments is applicable to an organic light-emitting display panel having a scattering layer. The scattering layer may be provided on top of an overcoat layer 250. The scattering layer may be one selected from among a microlens array, a nano-pattern, a diffuse pattern, and silica beads. Hereinafter, the scattering layer will be referred to as the microlens array for the convenience of description, but any of the other types may be employed.

Although FIG. 8 illustrates a configuration in which microlenses are circular, example embodiments are not limited thereto. Rather, the microlenses may have a variety of shapes, such as a hexagon, a hemisphere, a half ellipse, and a quadrangle. The microlens array serves to outwardly extract light that would otherwise be trapped within the organic light-emitting display panel, thereby improving the light extraction efficiency of the organic light-emitting display panel.

Figure 9:
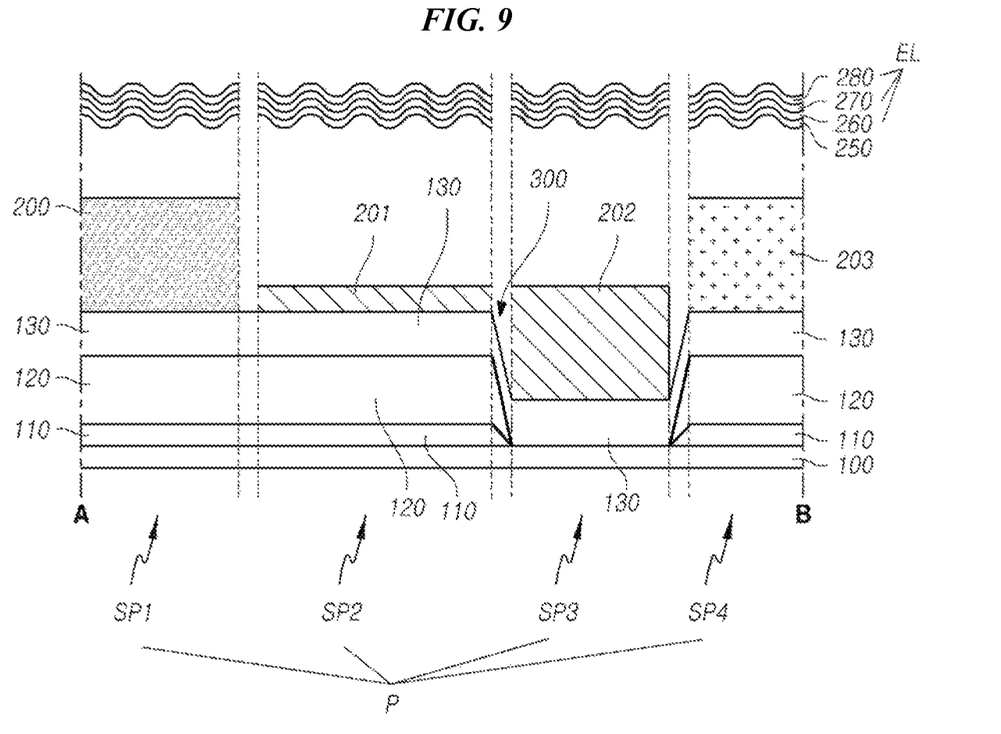
FIG. 9 is a cross-sectional view taken along line C-D in FIG. 8.

This configuration will be described in detail with reference to FIG. 9. FIG. 9 is a cross-sectional view taken along line C-D in FIG. 8.

As shown in FIG. 9, an overcoat layer 250 may be disposed on the color filter layers 200, 201, 202, and 203 of the subpixels SP1, SP2, SP3, and SP4. A plurality of microlenses may be provided on the overcoat layer 250. Organic electroluminescent devices (or OLEDs) EL may be disposed on the overcoat layer 250 having the plurality of microlenses. Each of the organic electroluminescent devices EL includes a first electrode 260, an organic light-emitting layer 270, and a second electrode 280. The subpixels emit light using the organic electroluminescent devices EL.

The first electrode 260 may include a transparent conductive material, while the second electrode may include an opaque conductive material having a high level of reflectance. Accordingly, a bottom-emission organic light-emitting display panel can be provided.

In the above-described configuration, the refractive index of either the first electrode 260 or the organic light-emitting layer 270 of the organic electroluminescent device EL may be higher than the refractive index of either the substrate 100 or the overcoat layer 250. For example, the refractive index of the substrate 100 and the overcoat layer 250 may be about 1.5, while the refractive index of the first electrode 260 or the organic light-emitting layer 270 of the organic electroluminescent device EL may be 1.7 to 2.0.

A portion of light emitted by the organic light-emitting layer 270 may be reflected by the second electrode 280 to be redirected toward the first electrode 260, while the remaining portion of the light may be emitted toward the first electrode 260. Thus, most of the light emitted by the organic light-emitting layer 270 may be directed toward the first electrode 260.

Since the refractive index of the organic light-emitting layer 270 may be substantially the same as the refractive index of the first electrode 260, the path of light generated by the organic light-emitting layer 270 may be unchanged at the boundary between the organic light-emitting layer 270 and the first electrode 260. A portion of light that has passed through the first electrode 260, striking the boundary between organic light-emitting layer 270 and the first electrode 260 at an angle equal to or smaller than a total reflection critical angle, can exit the substrate 100 through the color filter layers 200, 201, 202, and 203 disposed in the subpixels SP1, SP2, SP3, and SP4.

Since the organic light-emitting display panel according to example embodiments may include the overcoat layer 250 having the microlens array, external light reflectance may be increased.

Specifically, a polarizer having a polarizing axis in a predetermined direction and a polarizer having a predetermined value of phase delay may be disposed on the bottom surface of the substrate 100 such that the two polarizers overlap each other. When external light incoming through the bottom of the substrate strikes the polarizers, the portion of the light in the same direction as the polarizing axis is allowed to pass therethrough. The light polarized in a specific direction may be circularly polarized at the predetermined value of phase delay before entering the substrate 100. The light that has entered the substrate 100 may be reflected by the second electrode 280 of the organic electroluminescent device EL, so that the phase thereof may be delayed by 180° with respect to the phase of the light that has passed through the polarizers. The phase-delayed light can be redirected toward the substrate 100.

Since the overcoat layer 250 may have the microlens array, the first electrode 260, the organic light-emitting layer 270, and the second electrode 280 of the organic electroluminescent device EL may also shaped such that protrusions alternate with depressions. The second electrode 280 reflects light incoming from the substrate 100, such that a portion of the reflected light is converted in the direction opposite to the polarizing axis of the polarizer.

However, since the second electrode 280 is not flat in this example, the remaining portion of the light incoming from the substrate 100 may be reflected in the same state as the polarizing axis of the polarizer. This can consequently improve the reflectance of the organic light-emitting display device.

The color filter layers 200, 201, 202, and 203 respectively disposed in the subpixels SP1, SP2, SP3, and SP4 may serve to absorb such external light, thereby reducing external light reflectance. Specifically, in the organic light-emitting display panel including the microlens array, the color filter layers 200, 201, 202, and 203 may be advantageously disposed in the subpixels SP1, SP2, SP3, and SP4 not only to increase color purity but also to reduce external light reflectance.

In addition to the configuration shown in FIG. 9, various other configurations of the insulating layer and of the slope at the boundary between the second subpixels and one or more adjacent subpixels may be employed. For example, the example configurations relating to the insulating layer in the first subpixel SP1 or the third subpixel SP3 and the slope at the boundary with the second subpixels SP2 as discussed above with respect to the first to the fifth example embodiments are similarly applicable to the example embodiment with a scattering layer and the organic luminescent device EL as shown in FIGS. 8 and 9.

In the display panel according to example embodiments, when the color filter layers of the same color are disposed in two or more adjacent subpixels, the thickness of the insulating layer disposed under one color filter layer may differ from the thickness of the insulating layer disposed under the adjacent color filter layer. At least one subpixel of the adjacent subpixels may be a white subpixel. This allows the insulating layer to have a slope at the boundary between the adjacent subpixels. The slope allows the organic material, used for manufacturing the color filter layers, to flow in the direction of the subpixel in which the insulating layer is thinner than in the adjacent subpixel. This can consequently allow for adjustment of the thicknesses of the color filter layers, thereby simplifying the manufacturing process.

That is, the insulating layer disposed under the color filter layer in the white subpixel may include a plurality of component insulating layers, and the insulating layer disposed in at least one adjacent subpixel may include a single layer or fewer component layers than the insulating layer disposed in the white subpixel. Accordingly, in the at least one subpixel adjacent to the white subpixel, the thickness of the insulating layer may be smaller than the thickness of the insulating disposed in the white subpixel. The difference in thickness forms the slope, which serves to simplify the process of forming the color filter layers.

The features, structures, and effects described in the present disclosure as being employed in at least one example embodiment are not necessarily limited to that particular embodiment. A person skilled in the art can apply the features, structures, and effects illustrated in one particular example embodiment to other example embodiments by combining or modifying such features, structures, and effects. It should be understood that all such combinations and modifications are included within the scope of the present disclosure.

It will be apparent to those skilled in the art that various modifications and variations can be made in the array substrate and the display panel including the same of the present disclosure without departing from the spirit or scope of the invention. Thus, it is intended that the present invention cover the modifications and variations of the example embodiments, configurations, components, and functions discussed above provided that they come within the scope of the appended claims and their equivalents.

What is claimed is:

1. An array substrate for a display device, comprising:
   a substrate comprising a plurality of subpixels, at least one of which is a white subpixel;
   an insulating layer disposed on the substrate in each of the subpixels; and
   a plurality of color filter layers disposed on the insulating layer, each of the color filter layers being disposed respectively in a corresponding one of the subpixels,
   wherein at least two of the color filter layers have a same color and are respectively disposed in the white subpixel and in at least one of the subpixels adjacent to the white subpixel, and the color filter layer disposed in the white subpixel is thinner than the color filter layer disposed in the at least one of the subpixels adjacent to the white subpixel, and
   wherein the color filter layer disposed in the at least one subpixel adjacent to the white subpixel has a stepped portion in at least one portion near a boundary between the white subpixel and the at least one subpixel adjacent to the white subpixel.

2. The array substrate of claim 1, wherein the insulating layer in the at least one subpixel adjacent to the white subpixel is thinner than the insulating layer in the white subpixel.

3. The array substrate of claim 1, wherein a distance between a bottom surface of the color filter layer in the white subpixel and a top surface of the substrate is greater than a distance between a bottom surface of the color filter layer in the at least one subpixel adjacent to the white subpixel and the top surface of the substrate.

4. The array substrate of claim 1, wherein the color filter layer disposed in the white subpixel and the color filter layer disposed in the at least one subpixel adjacent to the white subpixel are formed in a same manufacturing process.

5. The array substrate of claim 1, wherein the color filter layer disposed in the at least one subpixel adjacent to the white subpixel has a thickness of 0.5 to 3 μm.

6. The array substrate of claim 1, wherein the insulating layer comprises at least one of a buffer, a gate dielectric, and an interlayer dielectric.

7. The array substrate of claim 6, wherein the insulating layer comprises the buffer, the gate dielectric, and the interlayer dielectric in the white subpixel.

8. The array substrate of claim 6, wherein the insulating layer comprises only one or two of the buffer, the gate dielectric, and the interlayer dielectric in the at least one subpixel adjacent to the white subpixel.

9. The array substrate of claim 1, wherein the at least two of the color filter layers are made of a fluidic organic material.

10. The array substrate of claim 1, wherein the insulating layer has a same thickness in the white subpixel as in one of the subpixels other than the white subpixel and the at least one of the subpixels adjacent to the white subpixel.

11. A display panel, comprising:
   a substrate comprising a plurality of subpixels, including at least first and second subpixels adjacent to each other and configured to provide different colors from each other;

an insulating layer disposed on the substrate in each of the first and the second subpixels; and first and second color filter layers disposed on the insulating layer respectively in the first and the second subpixels, the first and the second color filter layers having a same color, wherein the first color filter layer is thinner than the second color filter layer, and wherein the second color filter layer has a stepped portion in at least one portion near a boundary between the first subpixel and the second subpixel.

12. The display panel of claim 11, wherein the insulating layer in the first subpixel is thicker than the insulating layer in the second subpixel.

13. The display panel of claim 12, wherein the insulating layer comprises a buffer, a gate dielectric, and an interlayer dielectric in the first subpixel, and comprises only one or two of the buffer, the gate dielectric, and the interlayer dielectric in the second subpixel.

14. The display panel of claim 11, wherein the first color filter layer and the second color filter layer are formed in a same manufacturing process.

15. The display panel of claim 11, wherein the first and the second color filter layers are made of a fluidic organic material.

16. The display panel of claim 11, wherein the first subpixel is a white subpixel.

17. The display panel of claim 11, further comprising an overcoat layer on the first and the second color filter layers, the overcoat layer including a light-scattering layer.

18. The display panel of claim 17, wherein the light scattering layer comprises a microlens array.

19. The display panel of claim 17, further comprising an organic electroluminescent device disposed on the overcoat layer, the organic electroluminescent device comprising a first electrode, an organic light-emitting layer on the first electrode, and a second electrode on the organic light-emitting layer.

20. The display panel of claim 19, wherein the first electrode includes a transparent conductive material, and the second electrode includes an opaque conductive material having a high level of reflectance.

* * * * *